(12) United States Patent
Boemler

(10) Patent No.: US 7,990,446 B2
(45) Date of Patent: *Aug. 2, 2011

(54) HIGH DYNAMIC RANGE PIXEL AMPLIFIER

(75) Inventor: Christian Boemler, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 862 days.

This patent is subject to a terminal disclaimer.

(21) Appl. No.: 11/454,883

(22) Filed: Jun. 19, 2006

(65) Prior Publication Data

US 2006/0243887 A1    Nov. 2, 2006

Related U.S. Application Data

(63) Continuation of application No. 10/819,167, filed on Apr. 7, 2004, now Pat. No. 7,091,531.

(51) Int. Cl.
*H04N 3/14* (2006.01)
*H04N 5/335* (2011.01)
*H01L 31/062* (2006.01)
*H01L 31/113* (2006.01)
*H01L 27/00* (2006.01)

(52) U.S. Cl. ............... 348/294; 250/208.1; 257/292

(58) Field of Classification Search ........ 348/294–324; 250/208.1; 257/291–293
See application file for complete search history.

(56) References Cited

U.S. PATENT DOCUMENTS

| | | | | |
|---|---|---|---|---|
| 6,246,436 B1* | 6/2001 | Lin et al. | ........... | 348/308 |
| 6,310,369 B1 | 10/2001 | Narabu et al. | | |
| 6,331,873 B1* | 12/2001 | Burke et al. | ........... | 348/314 |
| 6,590,238 B1* | 7/2003 | Parks | ........... | 257/226 |
| 6,781,167 B2* | 8/2004 | Uya et al. | ........... | 257/215 |
| 6,850,278 B1* | 2/2005 | Sakurai et al. | ........... | 348/302 |
| 7,075,049 B2* | 7/2006 | Rhodes et al. | ........... | 250/208.1 |
| 7,091,531 B2* | 8/2006 | Boemler | ........... | 257/222 |
| 7,498,623 B2* | 3/2009 | Hong | ........... | 257/292 |
| 2004/0036784 A1 | 2/2004 | Bock | | |
| 2004/0223065 A1 | 11/2004 | Takayanagi | | |
| 2005/0092894 A1* | 5/2005 | Fossum | ........... | 250/208.1 |

OTHER PUBLICATIONS

U.S. Appl. No. 10/685,792, Berezin.
U.S. Appl. No. 10/696,559, Fossum.

* cited by examiner

*Primary Examiner* — Nhan T Tran
*Assistant Examiner* — Tuan Le
(74) *Attorney, Agent, or Firm* — David C. Kellogg

(57) ABSTRACT

A pixel cell with increased dynamic range is formed by providing a floating diffusion region having a variable capacitance, controlled by at least one gate having source and drain regions commonly connected to the floating diffusion region. The gate has an intrinsic capacitance which, when the gate is activated, is added to the capacitance of the floating diffusion region, providing a low conversion gain readout. When the gate is off, the floating diffusion region capacitance is minimized, providing a high conversion gain readout. The gate may also be selectively switched to mid-level. At mid-level, a mid-level conversion gain, which is between the high and low conversion gains, readout is provided, but the gate still provides some capacitance to prevent the floating diffusion region from saturating.

9 Claims, 16 Drawing Sheets

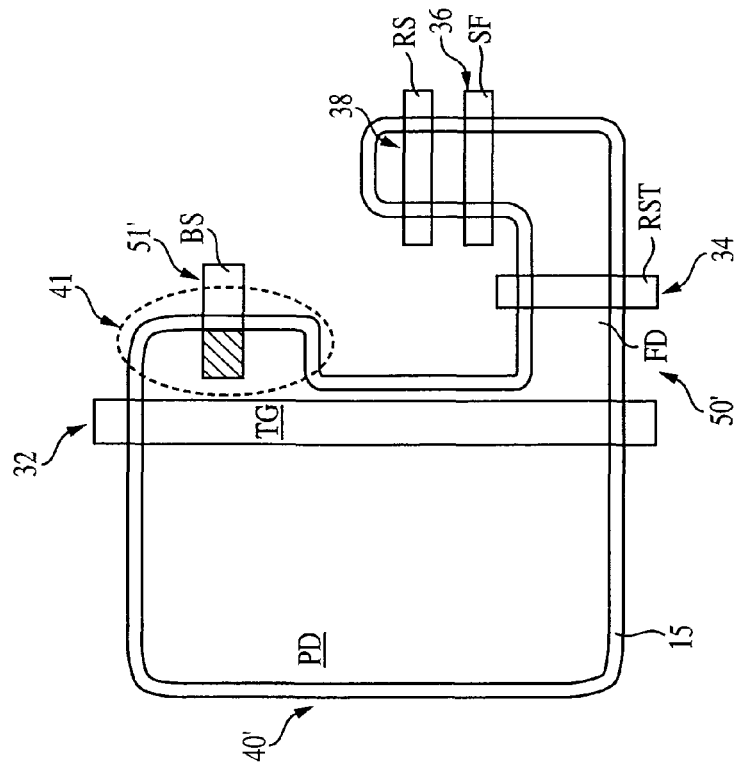
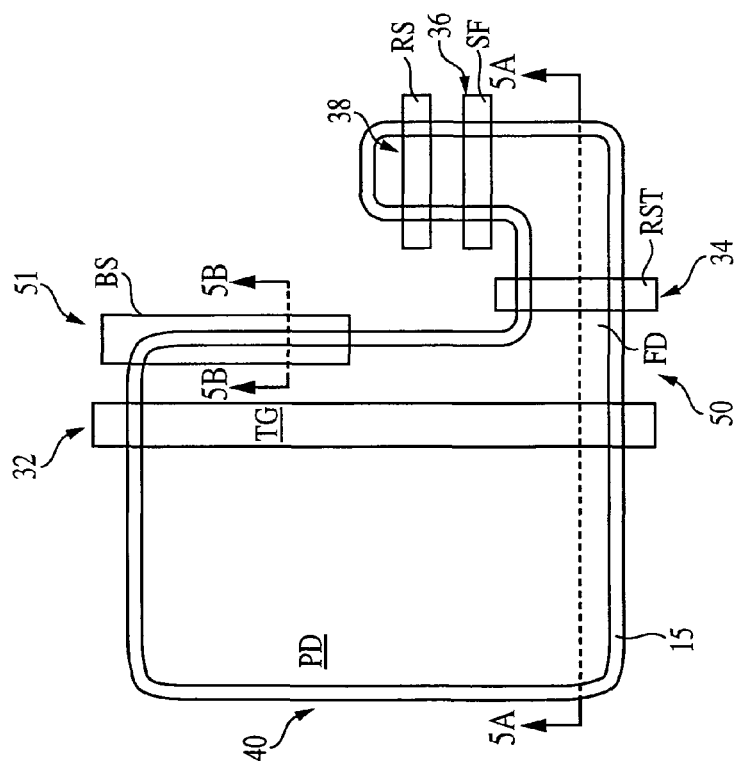
FIG. 4A
FIG. 4B

HIGH DYNAMIC RANGE PIXEL AMPLIFIER

CROSS REFERENCE TO RELATED APPLICATIONS

The present application is a Continuation of U.S. patent application Ser. No. 10/819,167, filed on Apr. 7, 2004 now U.S. Pat. No. 7,091,531, the disclosure of which is incorporated by reference in its entirety.

FIELD OF THE INVENTION

The invention relates to the field of semiconductor devices and, in particular, to a high dynamic range pixel amplifier for an imager.

BACKGROUND OF THE INVENTION

A CMOS imager circuit includes a focal plane array of pixel cells, each cell includes a photosensor, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion region. The imager may also include a transistor for transferring charge from the photosensor to the floating diffusion node and another transistor for resetting the floating diffusion region node to a predetermined charge level prior to charge transference. Each pixel cell is isolated from other pixel cells in the array by a field oxide region (STI) which surrounds it and separates the doped regions of the substrate within that pixel cell from the doped regions of the substrate within neighboring pixel cells.

In a CMOS imager, the active elements of a pixel cell, for example a four transistor pixel, perform the necessary functions of (1) photon to charge conversion; (2) resetting the floating diffusion node to a known state before the transfer of charge to it; (3) transfer of charge to the floating diffusion node; (4) selection of a pixel cell for readout; and (5) output and amplification of a signal representing a reset voltage and a pixel signal voltage based on the photo converted charges. The charge at the floating diffusion node is converted to a pixel output voltage by a source follower output transistor.

FIG. 1 illustrates a block diagram of a CMOS imager device 100 having a pixel array 110 with each pixel cell being constructed as described above. The pixel array 110 comprises a plurality of pixels arranged in a predetermined number of columns and rows. The pixels of each row in the array 110 are all turned on at the same time by a row select line, and the pixels of each column are selectively output by respective column select lines. A plurality of row and column lines are provided for the entire array 110. The row lines are selectively activated by a row driver 145 in response to a row address decoder 155. The column select lines are selectively activated by a column driver 160 in response to a column address decoder 170. Thus, a row and column address is provided for each pixel.

The CMOS imager 100 is operated by a control circuit 150 that controls address decoders 155, 170 for selecting the appropriate row and column lines for pixel readout, and row and column driver circuitry 145, 160 that apply driving voltage to the drive transistors of the selected row and column lines. The pixel column signals, which typically include a pixel reset signal Vrst and a pixel image signal Vsig for each row selected pixel in a column are read by sample and hold circuitry 161 associated with the column device 160. A differential signal Vrst-Vsig is produced for each pixel, which is amplified and digitized by analog-to-digital converter 175. The analog-to-digital converter 175 converts the analog pixel signals to digital signals that are fed to an image processor 180 to form a digital image output.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, assigned to Micron Technology, Inc. The disclosures of each of the forgoing patents are hereby incorporated by reference in their entirety.

A schematic diagram of an exemplary CMOS pixel four-transistor (4T) pixel cell 10 is illustrated in FIG. 2. The four transistors include a reset transistor 34, source follower transistor 36, row select transistor 38 and a transfer transistor 32. A photosensor 40 converts incident light into a charge. A floating diffusion region 50 receives charge from the photosensor 40 through the transfer transistor 32 and is connected to the reset transistor 34 and the source follower transistor 36. The source follower transistor 36 outputs a signal proportional to the charge accumulated in the floating diffusion region 50 to a sampling circuit when the row select transistor 38 is turned on. The reset transistor 34 resets the floating diffusion region 50 to a known potential prior to transfer of charge from the photosensor 40 and this reset signal is output and sampled by the sampling circuit. The photosensor 40 may be a photodiode, a photogate, or a photoconductor. If a photodiode is employed, the photodiode may be formed below a surface of the substrate and may be a buried PNP photodiode, buried NPN photodiode, a buried PN photodiode, or a buried NP photodiode, among others.

Image sensors, such as an image sensor employing the conventional pixel cell 10, have a characteristic dynamic range. Dynamic range refers to the range of incident light that can be accommodated by an image sensor in a single frame of pixel data. It is desirable to have an image sensor with a high dynamic range to image scenes that generate high dynamic range incident signals, such as indoor rooms with windows to the outside, outdoor scenes with mixed shadows and bright sunshine, night-time scenes combining artificial lighting and shadows, and many others.

The dynamic range for an image sensor is commonly defined as the ratio of its largest non-saturating signal to the standard deviation of the noise under dark conditions. The dynamic range is limited on an upper end by the charge saturation level of the sensor, and on a lower end by noise imposed limitations and/or quantization limits of the analog-to-digital converter used to produce the digital image. When the dynamic range of an image sensor is too small to accommodate the variations in light intensities of the imaged scene, e.g., by having a low saturation level, image distortion occurs.

In a conventional CMOS pixel imager with a photodiode, the photodiode converts incident light to an electrical charge. The photodiode accumulates this charge throughout an integration period. At the end of the integration period, the transfer gate is activated, and the charge is transferred from the photodiode to the floating diffusion region.

When the incident light is of low-intensity such that the charge transferred from the photosensor to the floating diffusion region is low, the signal is very faint. In such a case, it is desirable for the conversion gain (i.e., the ratio of output voltage to input charge) to be high. When the incident light is of high-intensity such that the charge transferred from the photosensor to the floating diffusion region is greater than the capacity of the floating diffusion region, excess charge may overflow and saturate the pixel cell. In such a case, it is desirable that the conversion gain be low.

However, with conventional imagers, the floating diffusion regions in a pixel array have a fixed capacitance, which means a fixed conversion gain. That is, for a single integration period, all pixel signals are provided with the same conversion gain. As a result, some pixels may saturate while others may provide a faint signal, limiting the dynamic range of the image sensor. Thus, there is a desire and need for a pixel cell capable of selectively attaining a high conversion gain or a low conversion gain to increase the dynamic range of the image sensor.

BRIEF SUMMARY OF THE INVENTION

The present invention provides a pixel cell capable of selectively attaining a high or low conversion gain.

In one exemplary embodiment of the invention, a pixel cell is provided which includes a floating diffusion region with a variable capacitance controlled by a gate, having its own intrinsic capacitance. The source and drain regions of the gate are coupled to the floating diffusion region. When the gate is on, the capacitance of the gate is added to that of the floating diffusion region, effectively increasing the capacitance of the floating diffusion region. When the gate is off, the capacitance of the gate is no longer combined with that of the floating diffusion region, thereby reducing the capacitance of the floating diffusion region to solely the floating diffusion region capacitance.

The pixel cell is capable of providing two or more different non-destructive readouts of the same image signal from the same integration. One readout is taken with the gate on, a second readout is taken with the gate off. This switchability allows the floating diffusion region to have a greater capacitance in the case of high-intensity light or a lower capacitance in the case of low-intensity light. The benefit of having a floating diffusion region with a greater capacitance when the incident light has high intensity is that it provides a lower conversion gain, and thus lower sensitivity readout. Conversely, the floating diffusion may have a lower capacitance when the incident light is of low intensity, providing a higher conversion gain, and thus higher sensitivity readout. The two readouts may be combined to provide a single pixel output signal having a desired level of conversion gain, or one of the pixel output signals can be discarded and the other used during image processing.

In another exemplary embodiment, the gate may also be switched to a mid-level (between the on and off states), where the voltage applied to it is approximately midway between an on-voltage and ground. When the gate is at mid-level, a portion of the capacitance of the gate is added to that of the floating diffusion region if the voltage on the floating diffusion region is a threshold voltage below the mid-level gate voltage. This embodiment implements a variable capacitor with built-in threshold in a single transistor, providing a knee in the output charge-voltage profile of a pixel. The knee, created at a desired mid-level voltage, permits high conversion gain for low-intensity light situations and low conversion gain for high-intensity light situations. The kneepoint may be adjusted by adjusting the gate voltage. In this embodiment, a single readout is taken.

In other exemplary embodiments of the present invention, a switchable gate having intrinsic capacitance is coupled to a floating diffusion region at various locations and in various arrangements relative to the floating diffusion region.

BRIEF DESCRIPTION OF THE DRAWINGS

These and other features and advantages of the invention will be better understood from the following detailed description, which is provided in connection with the accompanying drawings, in which:

FIG. 4a is a plan view of a pixel cell according to an embodiment of the invention;

FIG. 4b is a plan view of a pixel cell according to another embodiment of the invention;

FIGS. 6C'-6D' are charge-voltage graphs of a pixel cell of the embodiment of FIGS. 6A-6D of the present invention;

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

Figure 2:
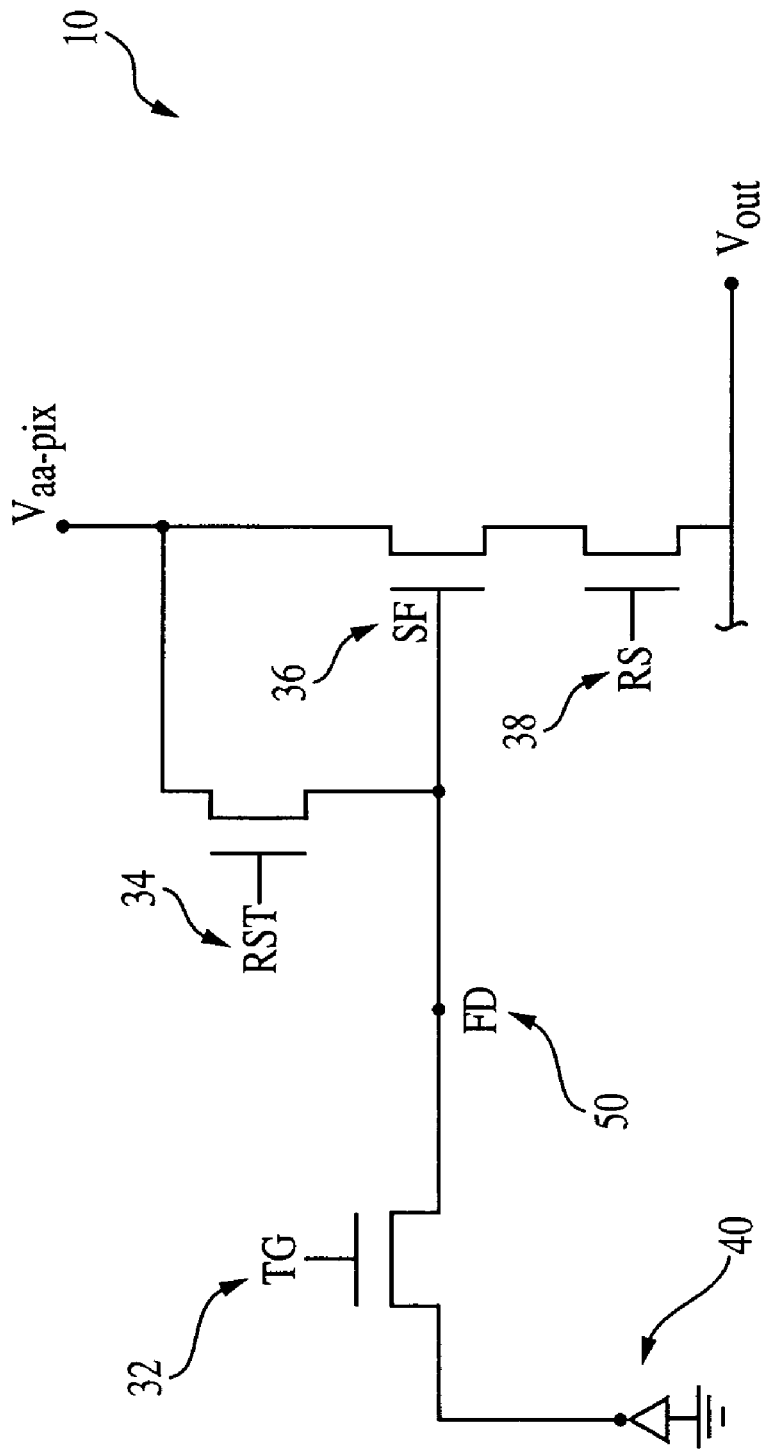
FIG. 2 is a schematic diagram of a four-transistor (4T) pixel.
Figure 3:
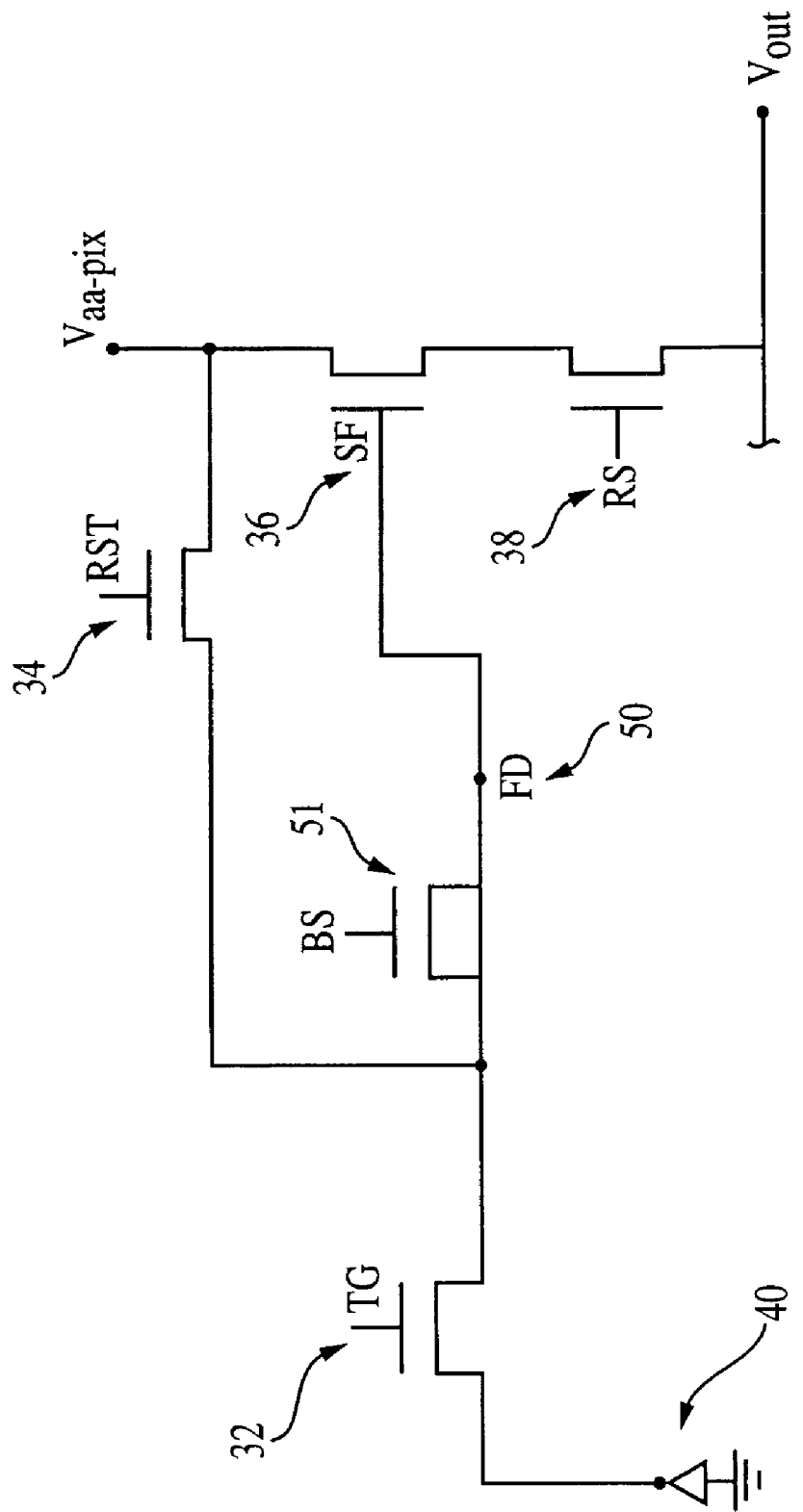
FIG. 3 is a schematic diagram of an exemplary five-transistor (5T) pixel of the invention.

The term "pixel" refers to a photo-element unit cell containing a photoconversion device or photosensor and transistors for processing an electrical signal from electromagnetic radiation sensed by the photoconversion device. The pixels discussed herein are illustrated and described as inventive modifications to four transistor (4T) pixel circuits for the sake of example only. It should be understood that the invention is not limited to a four transistor (4T) pixel, but may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels, such as a CCD or other imager. The following detailed description is, therefore, not to be taken in a limiting sense, and the scope of the present invention is defined only by the appended claims Referring now to the drawings, where like elements are designated by like reference numerals, FIG. 3 illustrates a schematic diagram of an exemplary five-transistor (5T) pixel 20 circuit embodiment of the invention. Pixel 20 has all the elements of the prior art pixel 10 shown in FIG. 2, including a transfer gate 32 (TG), reset transistor 34, source follower transistor 36, row select transistor 38, photosensor 40 (PD), and floating diffusion region 50 (FD). As with the pixel 10 of prior art, the photosensor 40 may be a photodiode, a photogate, or a photoconductor. Pixel 20 also includes a novel booster switch 51 (BS).

Booster switch 51 has an intrinsic capacitance and is provided to selectively increase the capacitance of the floating diffusion region 50. The booster switch 51 is a gate having source and drain terminals commonly connected to the floating diffusion region 50 and is designed to selectively change the capacitance of the floating diffusion region 50 at least once in a single integration period. The degree to which the booster switch 51 increases the capacitance of the floating diffusion region 50 is controlled by a circuit that supplies a voltage being applied to the gate of the booster switch 51.

Figure 5A:
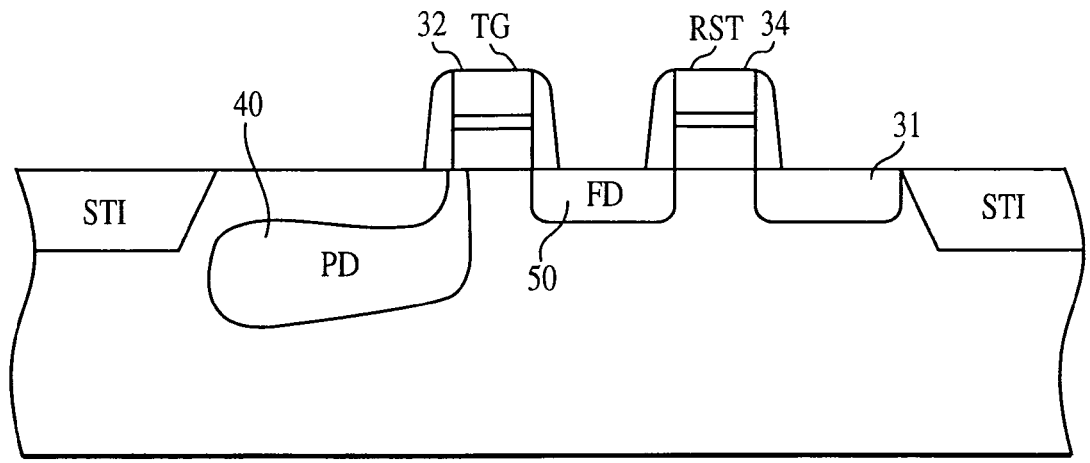
FIGS. 5A and 5B are cross sections of the pixel cell of FIG. 4A, taken along line 5A-5A and 5B-5B, respectively.
Figure 5B:
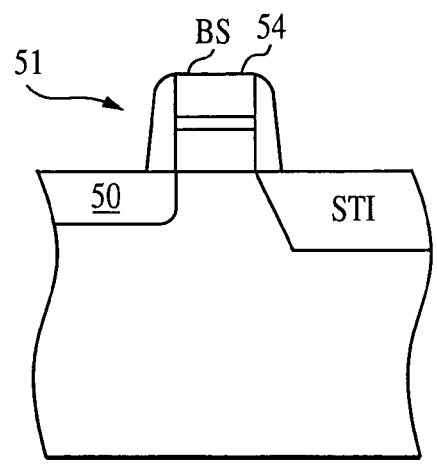

FIGS. 4A and 4B illustrate respective plan views of two exemplary pixel cell embodiments of the present invention 20, 20' having different layout configurations. FIG. 4A illustrates pixel cell 20 including a transfer gate 32, reset transistor 34, source follower transistor 36, row select transistor 38, photosensor 40, and floating diffusion region 50. Pixel cell 20 also has a booster switch 51 fabricated as a gate positioned parallel to the transfer gate 32. The pixel cell 20' of FIG. 4B also includes a transfer gate 32, reset transistor 34, source follower transistor 36, row select transistor 38, photosensor 40', floating diffusion region 50', and booster switch 51'. However, the photosensor 40' of FIG. 4B has an extended region 41 past the transfer gate 32 such that the booster switch 51' may be positioned perpendicular to the transfer gate 32. In the illustrated embodiments, the booster switches 51, 51' sit respectively adjacent to the floating diffusion regions 50, 50'. FIGS. 5A and 5B are cross sectional views of the pixel cell 20 of FIG. 4A taken along lines 5A-5A and 5B-5B, respectively. The booster switch 51 shown in FIG. 5B has a gate structure 54 and source and drain regions which are commonly connected to the floating diffusion region 50, as shown in FIG. 5A. The operation of these components is illustrated and discussed below with respect to the potential diagrams of FIGS. 6-8.

Referring to the substrate potential diagrams of FIGS. 6-8, the labels PD, TG, BS and FD are used to represent regions of the photosensor 40, transfer gate 32, booster switch 51, and floating diffusion region 50, respectively. At the outset, and referring back to FIG. 3, reset transistor 34 is turned on to reset the floating diffusion region 50 to a known state, which is read out by source follower transistor 36 through an "on" row select transistor 38 onto output line Vout. During the reset of the floating diffusion region, it may be beneficial to have the booster switch 51 voltage at ground to reduce kTC noise component in the high conversion gain range of operation. In the low conversion gain range of operation, the noise will be dominated by photon noise. Next, and now also referring to FIG. 6A, charge is generated and accumulated by the photosensor 40 (PD) during an integration period. The transfer gate 32 (TG) is off and a first voltage is applied to the booster switch 51 (BS). The voltage turns the booster switch 51 (BS) on, providing the floating diffusion region 50 (FD) with a combined capacitance, including its own inherent capacitance and that of the booster switch 51 (BS). When the transfer gate 32 (TG) is then switched on after charge integration, as shown in FIG. 6B, the charge is transferred from the photosensor 40 (PD), through the transfer gate 32 (TG), and into the booster switch 51 (BS) and floating diffusion region 50 (FD). A small amount of charge is also stored in the transfer gate 32 (TG).

Figure 6A:
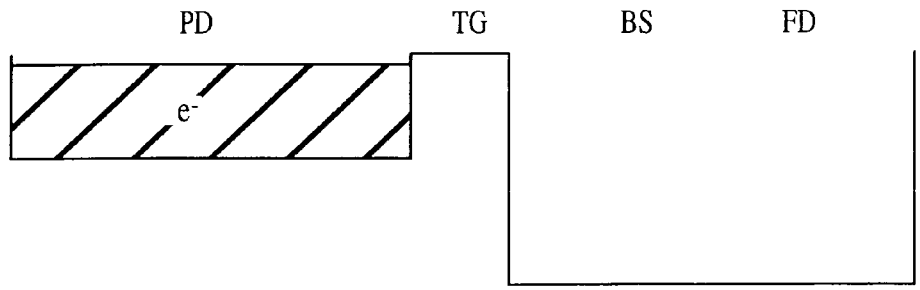
FIGS. 6A-6D are potential diagrams of the pixel cell of FIG. 4A having a near-full well.
Figure 6B:
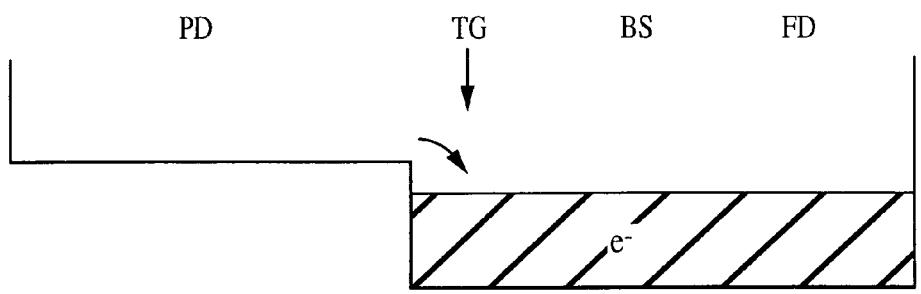
Figure 6C:
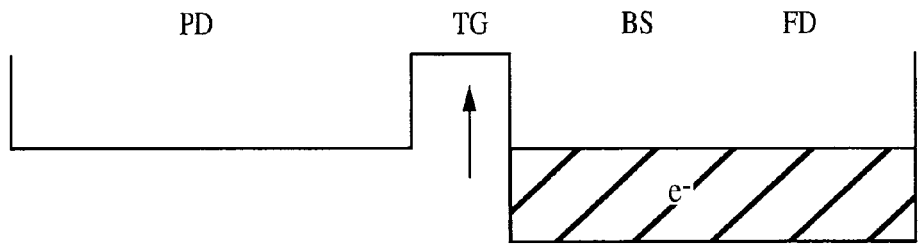

The transfer gate 32 (TG) is then switched off, as shown in FIG. 6C, and the residual amount of charge in the channel of the transfer gate 32 (TG) is transferred to the booster switch 51 (BS) and floating diffusion region 50 (FD). Substantially all of the photogenerated charge is now stored in the booster switch 51 (BS) and floating diffusion region 50 (FD). At this time, a first pixel image output reading may be taken through the row select transistor for the pixel and sampling the pixel output signal Vout (FIG. 3). This produces a first pixel image output signal Vsig1. Vsig1 is read along the charge-voltage profile shown in FIG. 6C'.

Figure 6D:
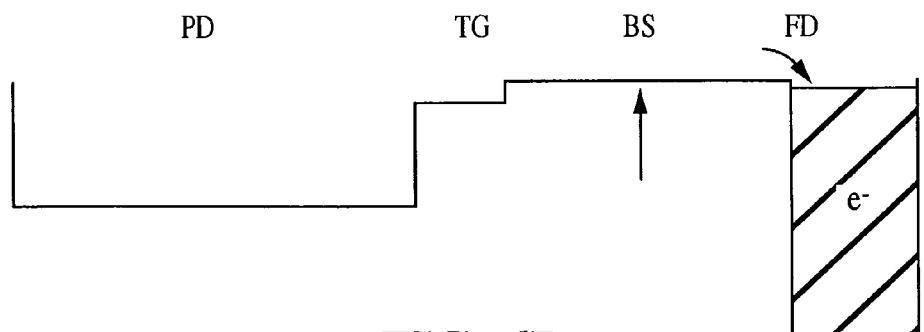
Figure 6C:
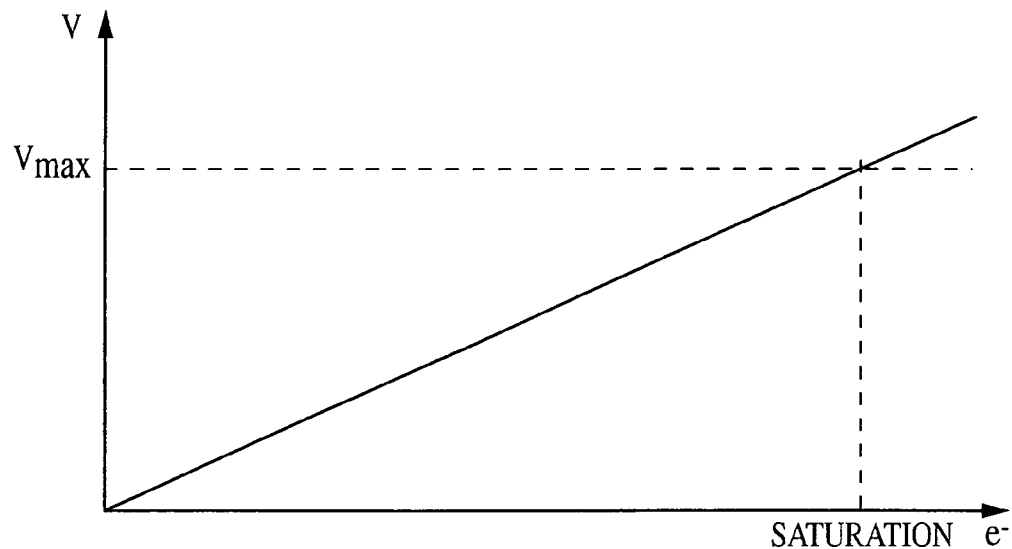
Figure 6D:
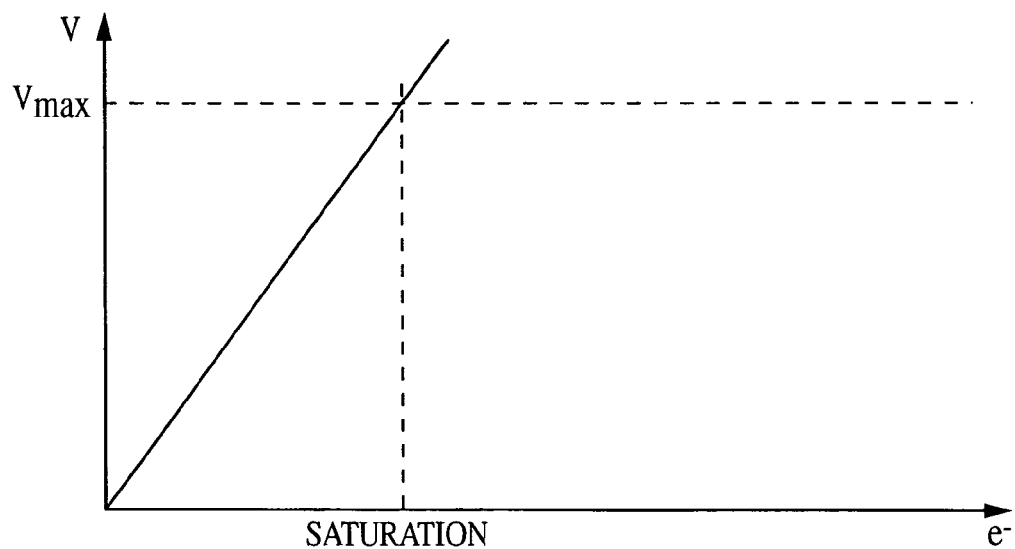

After the first output reading is taken, the voltage applied to the booster switch 51 (BS) is then brought to ground, turning the booster switch 51 (BS) completely off, as shown in FIG. 6D. Any charge stored in the booster switch 51 (BS) is transferred to the floating diffusion region 50 (FD), such that all of the photogenerated charge is stored in the floating diffusion region 50 (FD) alone. At this time, a second pixel output signal Vout reading may be taken to produce a second pixel image output signal Vsig2. Vsig2 is read along the charge-voltage profile shown in FIG. 6D'.

The first pixel output reading Vsig1 is a low sensitivity readout, even where the photosensor is nearly fully-saturated as shown in FIG. 6A. Since the booster switch 51 (BS) increases the capacitance of the floating diffusion region 50 (FD) by adding its own capacitance, the charge does not exceed the charge storage capacity of the floating diffusion region 50 (FD), as shown in FIG. 6C. This is also indicated in FIG. 6C', where the slope of the charge-voltage profile is inversely proportional to the sum of the capacitance of the booster switch and the capacitance of the floating diffusion region. This provides a low conversion gain reading for the pixel, which is beneficial for a nearly fully-saturated pixel, as the following discussion will demonstrate.

The second pixel output reading Vsig2 is a high sensitivity readout. Once the booster switch 51 (BS) is switched off, as shown in FIG. 6D, the floating diffusion region 50 (FD) may saturate. Since the booster switch 51 (BS) is off, the entire charge is captured on the floating diffusion region 50 (FD) and may overflow. This lower storage capacity is indicated in FIG. 6D', where the slope of the charge-voltage profile is inversely proportional to the charge storage capacity of the floating diffusion region alone. Comparing the charge-voltage profiles of FIGS. 6C' and 6D', it is apparent that the pixel will reach saturation and begin to overflow at a lower level of photogenerated charge in the case of FIG. 6D', where the slope of the charge-voltage profile is steeper. However, in the present invention, since the low conversion gain reading was taken prior to saturation of the floating diffusion region 50 (FD), the high light intensity signal is not lost as a result of the overflow.

The pixel readings Vrst, Vsig1, and Vsig2 may be combined in different ways. The combined signal can be digitized by an analog to digital converter, e.g., ADC 175 of FIG. 1, and sent to an image processor, e.g., image processor 180 of FIG. 1. For example, signals Vrst−Vsig1 and Vrst−Vsig2 can be produced, digitized, and sent to an image processor. Other possible combinations of the pixel read out are [Vrst−(Vsig1+Vsig2)/2] or Vrst can be combined with just one of Vsig1 and Vsig2 in accordance with a control signal from the image processor to produce Vrst−Vsig1 or Vsrst−Vsig2, which is digitized and fed to the image processor.

Figure 7A:
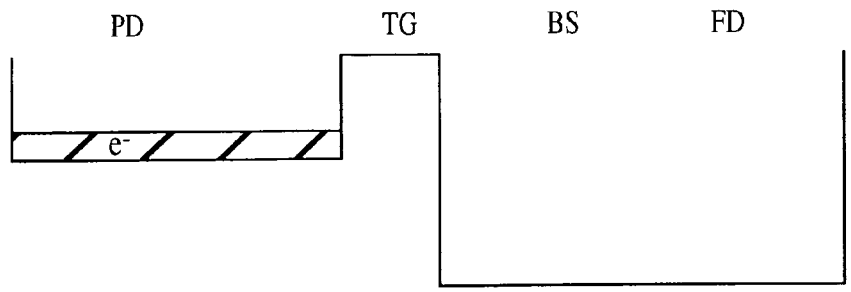
FIGS. 7A-7D are potential diagrams of the pixel cell of FIG. 4A having a near-empty well.
Figure 7B:
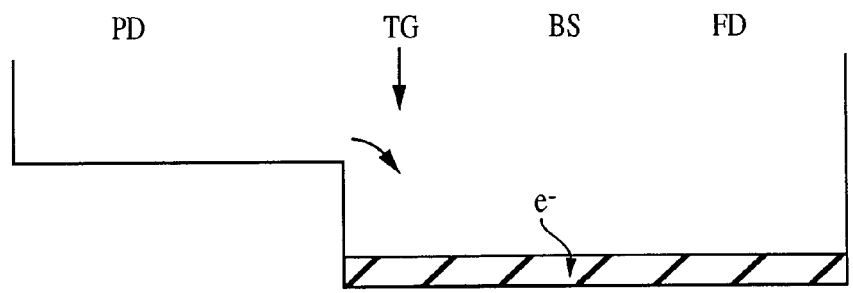

Another example of the two-stage reading method is illustrated in FIGS. 7A-7D, in the case where the photosensor 40 (PD) is nearly empty after charge integration, i.e., where there is a low level of incident light. After reset and dim charge integration, charge is generated and accumulated by the photosensor 40 (PD), as shown in FIG. 7A. The transfer gate 32 (TG) is off while a first voltage is applied to the booster switch 51 (BS). The voltage turns the booster switch 51 (BS) on, providing the floating diffusion region 50 (FD) with a combined capacitance, including its own inherent capacitance and that of the booster switch 51 (BS). When the transfer gate 32 (TG) is switched on after the integration period, the charge is transferred from the photosensor 40 (PD), through the transfer gate 32 (TG), and into the booster switch 51 (BS) and floating diffusion region 50 (FD), as shown in FIG. 7B. A small amount of charge is also stored in the transfer gate 32 (TG).

Figure 7C:
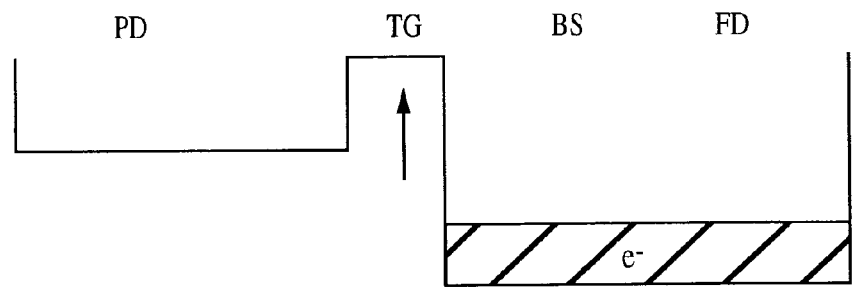
Figure 7D:
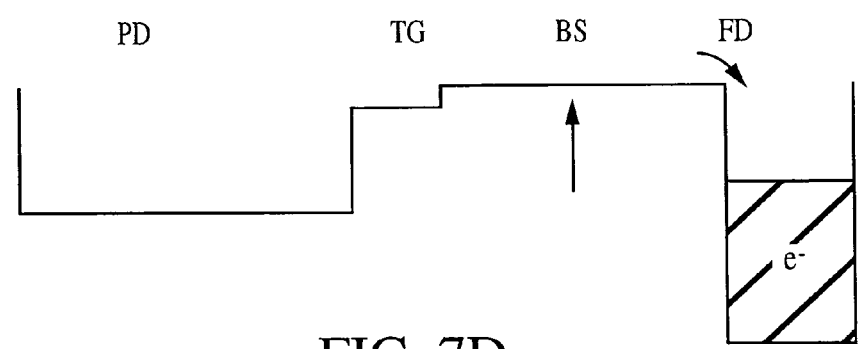

The transfer gate 32 (TG) is then switched off, as shown in FIG. 7C, and the residual amount of charge in the channel of the transfer gate 32 (TG) is transferred to the booster switch 51 (BS) and floating diffusion region 50 (FD). All of the photogenerated charge is stored in the booster switch 51 (BS) and floating diffusion region 50 (FD) combined. At this time, the first pixel output reading Vsig 1 may be taken. As shown in FIG. 7C, the first pixel output reading will be faint, or low, since the capacitance of the booster switch 51 (BS) and floating diffusion region 50 (FD) combined is far greater than the charge being sampled. However, once the booster switch 51 (BS) is turned off, the entire charge is captured on the floating diffusion region 50 (FD), thereby boosting the second pixel output reading Vsig2, as shown in FIG. 7D. In this case, a high conversion gain reading is provided and a higher pixel output signal is obtained.

In both illustrated cases, whether the level of incident light is high or low, the first and second pixel output readings may be combined to provide a single pixel output signal having a desired level of conversion gain, or one of the two signal output signals can be used as the pixel output signal for image processing.

Figure 8A:
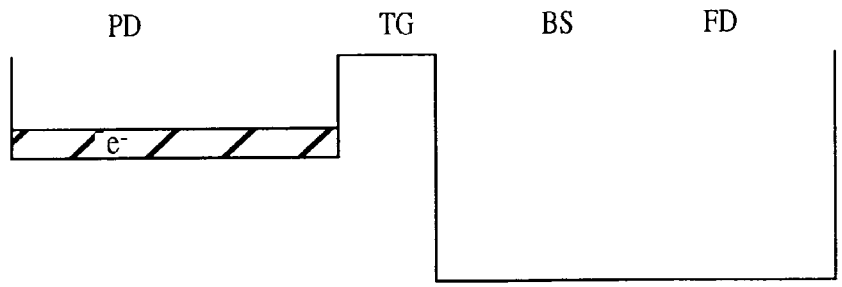
FIGS. 8A-8D are potential diagrams of the pixel cell of FIG. 4A having a near-empty well, where the booster switch is switched to a mid-level.
Figure 8B:
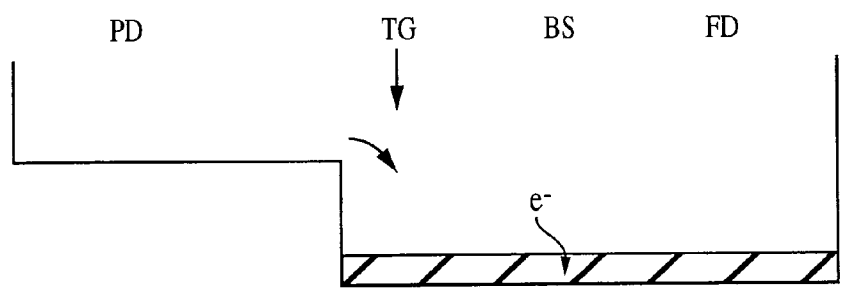

In another operational embodiment of the present invention depicted in FIGS. 8A-8H, only one pixel output reading is taken. FIGS. 8A-8D depict the potential diagram in a low intensity light setting, where the charge generated and accumulated by the photosensor 40 (PD) is low. As shown in FIG. 8A, the charge in the photosensor 40 (PD) is low, the transfer gate 32 (TG) is off, and a first voltage is applied to the booster switch 51 (BS). The voltage turns the booster switch 51 (BS) on, providing the floating diffusion region 50 (FD) with a combined capacitance, including its own inherent capacitance and that of the booster switch 51 (BS). When the transfer gate 32 (TG) is switched on, the charge is transferred from the photosensor 40 (PD), through the transfer gate 32 (TG), and into the booster switch 51 (BS) and floating diffusion region 50 (FD), as shown in FIG. 8B. A small amount of charge is also stored in the transfer gate 32 (TG).

Figure 8C:
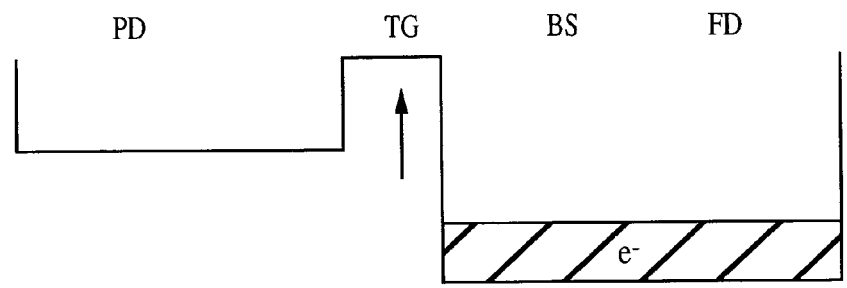

The transfer gate 32 (TG) is then switched off, as shown in FIG. 8C, and the residual amount of charge in the channel of the transfer gate 32 (TG) is transferred to the booster switch 51 (BS) and floating diffusion region 50 (FD). All of the photogenerated charge is stored in the booster switch 51 (BS) and floating diffusion region 50 (FD) combined.

It is important to note that the present invention can remove charge-sharing lag, caused by a high pin voltage (Vpin). For a high dynamic range pixel, the full well of the floating diffusion region must at least match the full well of the photosensor, the full well of the photosensor being the product of area and Vpin. In the field of imager semiconductor devices, minimized area is desirable. Therefore, in order to minimize area and still accommodate the full well of the photosensor, Vpin must be maximized, thus causing charge-sharing lag in a 4T pixel cell.

The present invention prevents charge-sharing lag while permitting a high Vpin by adding a booster switch and running it at a high voltage during charge transfer across the transfer gate, thereby providing a high capacitance floating diffusion region. Note that, but for charge-sharing lag, the circuit as described with a booster switch would work with a constant voltage on the booster switch as well as with a change in voltage on the booster switch. By pulsing the booster switch between supply (Vaa) and an intermediate voltage, a high Vpin can be tolerated without causing lag. Without pulsing the booster switch, the area of the photosensor would limit the dynamic range of the pixel.

Figure 8D:
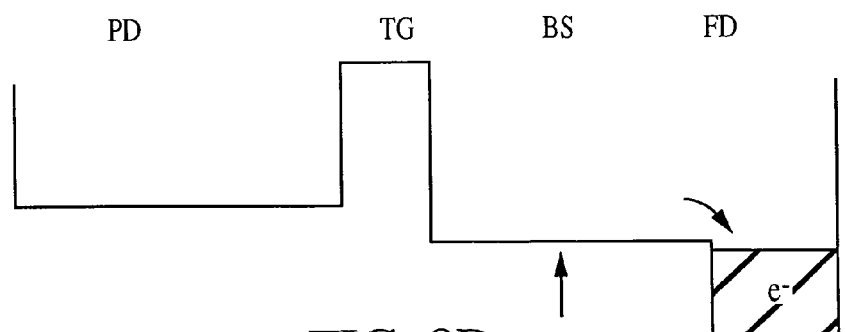

After the photogenerated charge has been transferred to the booster switch 51 (BS) and floating diffusion region 50 (FD), as shown in FIG. 8C, the voltage applied to the booster switch 51 (BS) may be lowered approximately midway between the first voltage and ground. In the case where the photogenerated charge is low due to low intensity light, all the charge is transferred from the booster switch 51 (BS) such that only the capacitance of the floating diffusion region 50 (FD) is used to store the charge, as shown in FIG. 8D. At this time, the pixel output reading may be taken.

Figure 8H:
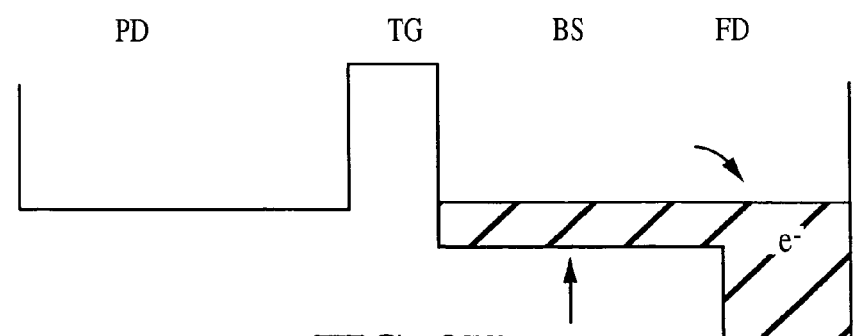
Figure 9:
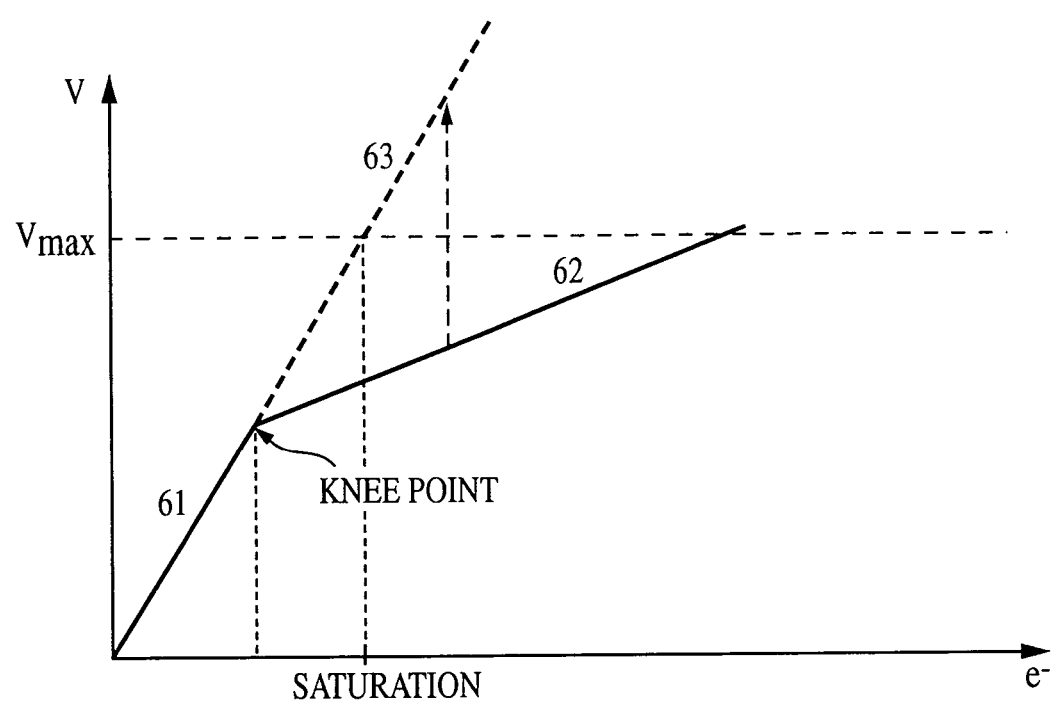
FIG. 9 is a charge-voltage graph of a pixel cell of the embodiment of FIGS. 8A-8H of the present invention.

According to this operation, the output reading is taken when the booster switch gate voltage is brought to a mid-level, which is designed to create a knee in the charge-voltage profile, as shown in FIG. 9. The term "knee" reflects the fact that an angle in the pixel output charge-voltage profile is created, as there are now two different conversion gains and charge-voltage profile regions with different slopes, one corresponding to charges which are only in the floating diffusion region, e.g., FIG. 8D, and the other corresponding to when the charge is of sufficient magnitude to flow into the gate capacitance region as well, e.g., FIG. 8H. Thus, the "knee" provides high conversion gain for low signals and low conversion gain for high signals.

Turning to FIG. 9, the first segment 61 of the charge-voltage profile below the knee reflects the higher conversion gain of the pixel when the booster switch is on, but the light intensity is low. The slope of the first segment 61 is inversely proportional to the capacitance of the floating diffusion region. A Vsig1 reading along the first segment 61 represents the voltage output for a low level of charge stored by capacitance of the floating diffusion region alone, despite the fact that the booster switch is at mid-level. When there is a higher level of charge (high intensity light setting), the Vsig1 reading will be along the second segment 62 above the knee. The second segment 62 has a slope that is inversely proportional to the sum of the capacitance of the floating diffusion region and the capacitance of the booster switch. The second segment 62 has a less-steep slope than the first segment 61, which reflects a lower conversion gain, where the capacitance of the booster switch at mid-level is engaged by storing some of the charge in the booster switch as well as in the floating diffusion region.

Figure 8E:
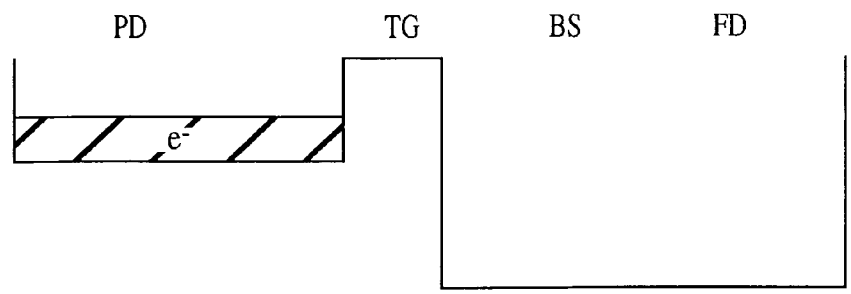
FIGS. 8E-8H are potential diagrams of the pixel cell of FIG. 4A having a partly-full well.
Figure 8F:
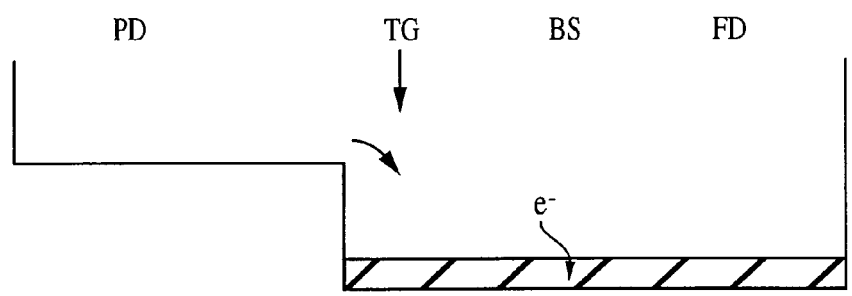
Figure 8G:
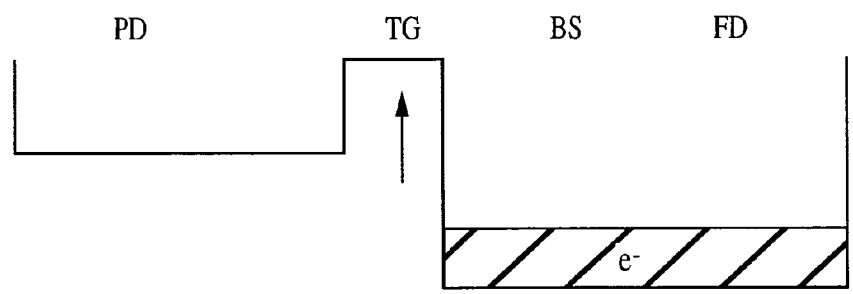

FIGS. 8E-8H illustrate the present embodiment in a high intensity light setting, where the charge generated and accumulated by the photosensor 40 (PD) is high. As shown in FIG. 8E, the charge in the photosensor 40 (PD) is high, the transfer gate 32 (TG) is off, and a first voltage is applied to the booster switch 51 (BS). The voltage turns the booster switch 51 (BS) on, providing the floating diffusion region 50 (FD) with a combined capacitance, including its own inherent capacitance and that of the booster switch 51 (BS). When the transfer gate 32 (TG) is switched on, the charge is transferred from the photosensor 40 (PD), through the transfer gate 32 (TG), and into the booster switch 51 (BS) and floating diffusion region 50 (FD), as shown in FIG. 8F. A small amount of charge is also stored in the transfer gate 32 (TG).

The transfer gate 32 (TG) is then switched off, as shown in FIG. 8G, and the residual amount of charge in the channel of the transfer gate 32 (TG) is transferred to the booster switch 51 (BS) and floating diffusion region 50 (FD). All of the photogenerated charge is stored in the booster switch 51 (BS) and floating diffusion region 50 (FD) combined.

After the photogenerated charge has been transferred to the booster switch 51 (BS) and floating diffusion region 50 (FD), as shown in FIG. 8G, the voltage applied to the booster switch 51 (BS) may be lowered approximately midway between the first voltage and ground. In the case where the photogenerated charge is high due to high intensity light, some of the capacitance of the booster switch 51 (BS) that was being combined with the capacitance of the floating diffusion region 50 (FD) is removed from the combined capacitance. Some of the charge is transferred from the booster switch 51 (BS) to the floating diffusion region 50 (FD) and some of the charge stays in the booster switch 51 (BS), as shown in FIG. 8H. At this time, the pixel output reading may be taken.

The readout voltage for the charge generated from a high intensity light setting will be in the second segment 62, as shown in FIG. 9, where the charge is stored in both the floating diffusion region and the booster switch at mid-level. The output voltage is calculated by extrapolating the readout voltage to segment 63. The segment 63 reflects the value of the charge-voltage profile of the floating diffusion region alone, which, without the knee created by the booster switch, would exceed the output capability of the pixel at a lower level of charge. The knee decision point can be adjusted by adjusting the decrease in voltage applied to the booster switch 51.

Figure 10:
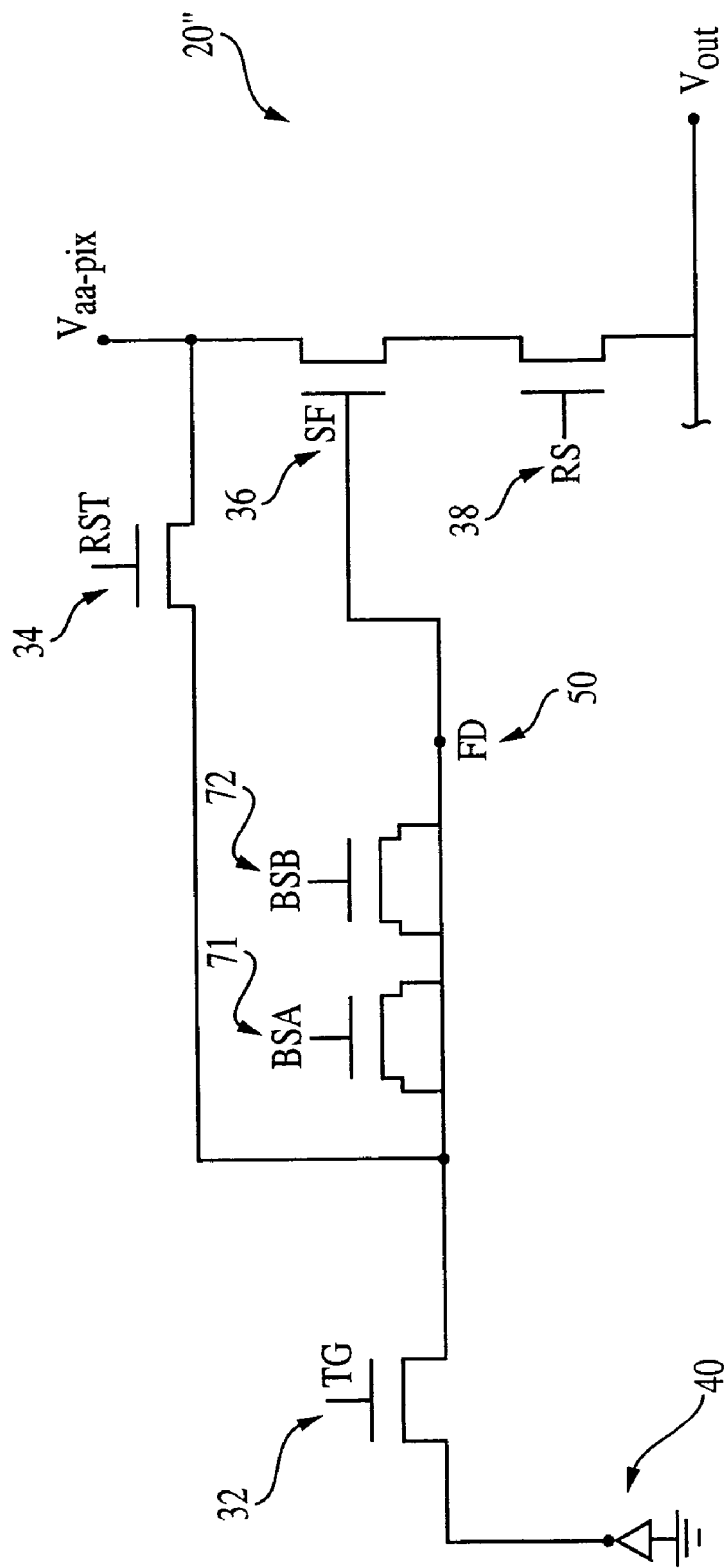
FIG. 10 is a schematic diagram of an exemplary six transistor (6T) pixel of the invention.

Having additional booster switches may further enhance the dynamic range of the pixel. More than one booster switch may be coupled to the floating diffusion region. FIG. 10 illustrates a schematic diagram of a six-transistor (6T) pixel 20 circuit embodiment of the invention. Pixel 20" has all the elements of the pixel 20 shown in FIG. 3, including a transfer gate 32 (TG), reset transistor 34, source follower transistor 36, row select transistor 38, photosensor 40 (PD), and floating diffusion region 50" (FD). The 6T pixel 20" in FIG. 10 includes two booster switches, booster switch A 71 (BSA) and booster switch B 72 (BSB).

Figure 11A:
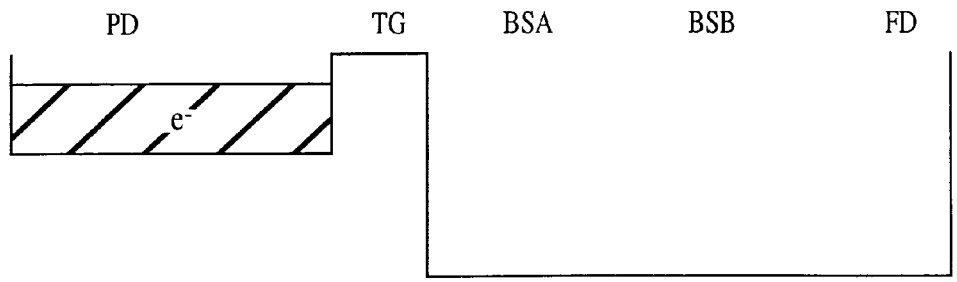
FIGS. 11A-11D are potential diagrams of the pixel cell of FIG. 10, where the booster switches are switched to different levels.
Figure 11B:
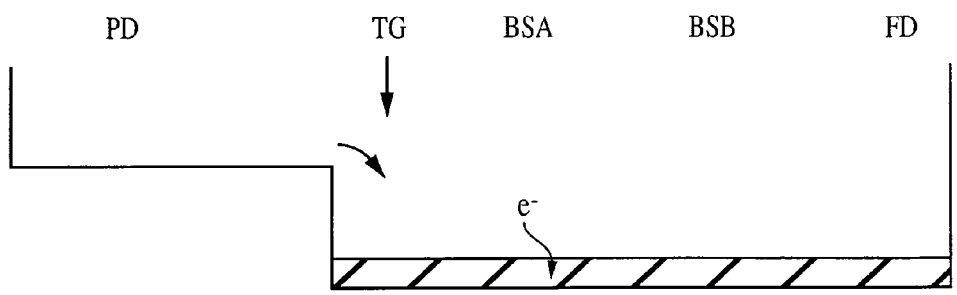

The operation of the 6T pixel 20 embodiment is depicted in FIGS. 11A-11D. In a first step, an exemplary level of charge is generated and accumulated by the photosensor 40 (PD), as shown in FIG. 11A. The transfer gate 32 (TG) is off and a first voltage is applied to both booster switches 71 (BSA) and 72 (BSB). The voltage turns the booster switches 71 (BSA) and 72 (BSB) on, providing the floating diffusion region 50 (FD) with a combined capacitance, including its own capacitance and the intrinsic capacitances of the booster switches 71 (BSA) and 72 (BSB). When the transfer gate 32 (TG) is switched on, the charge is transferred from the photosensor 40 (PD), through the transfer gate 32 (TG), and into the booster switches 71 (BSA) and 72 (BSB) and floating diffusion region 50 (FD), as shown in FIG. 11B. A small amount of charge is also stored in the transfer gate 32 (TG).

Figure 11C:
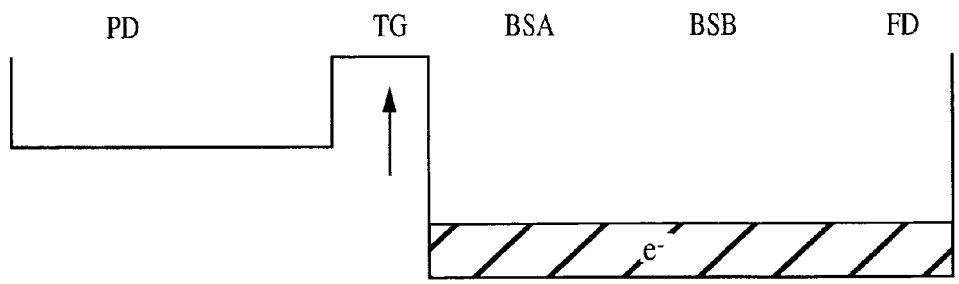

The transfer gate 32 (TG) is then switched off, as shown in FIG. 11C, and the residual amount of charge in the channel of the transfer gate 32 (TG) is transferred to the booster switches 71 (BSA) and 72 (BSB) and floating diffusion region 50 (FD). All of the photogenerated charge is stored in the booster switches 71 (BSA) and 72 (BSB) and floating diffusion region 50 (FD) combined.

Figure 11D:
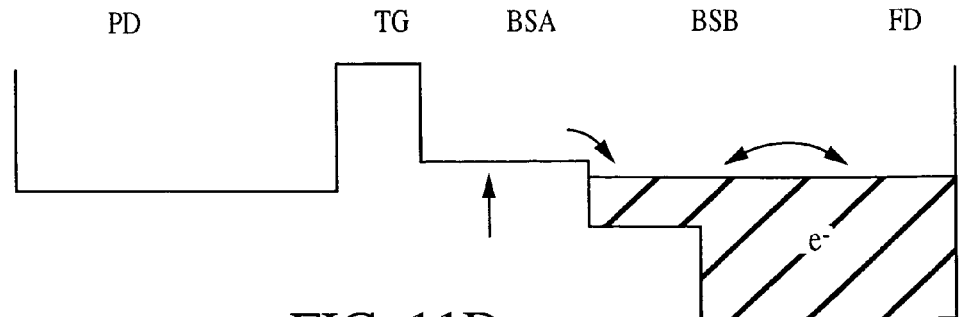

After the photogenerated charge has been transferred to the booster switch 71 (BSA) and 72 (BSB) and floating diffusion region 50 (FD), as shown in FIG. 11C, the voltage applied to the booster switch B 72 (BSB) may be lowered to a desired level between the first voltage and ground, while the voltage applied to the booster switch A 71 (BSA) may be lowered to a desired level between the voltage applied to the booster switch B 72 (BSB) and ground. In this case, some of the capacitances of the booster switches 71 (BSA) and 72 (BSB) that were being combined with the capacitance of the floating diffusion region 50 (FD) is removed from the combined capacitance, as shown in FIG. 11D. In this illustration, none of the charge is stored in the booster switch A 71 (BSA). Only a small amount of the charge is still stored in the booster switch B 72 (BSB), while most of the charge is stored in the floating diffusion region 50 (FD). At this time, the pixel output reading may be taken.

Figure 12:
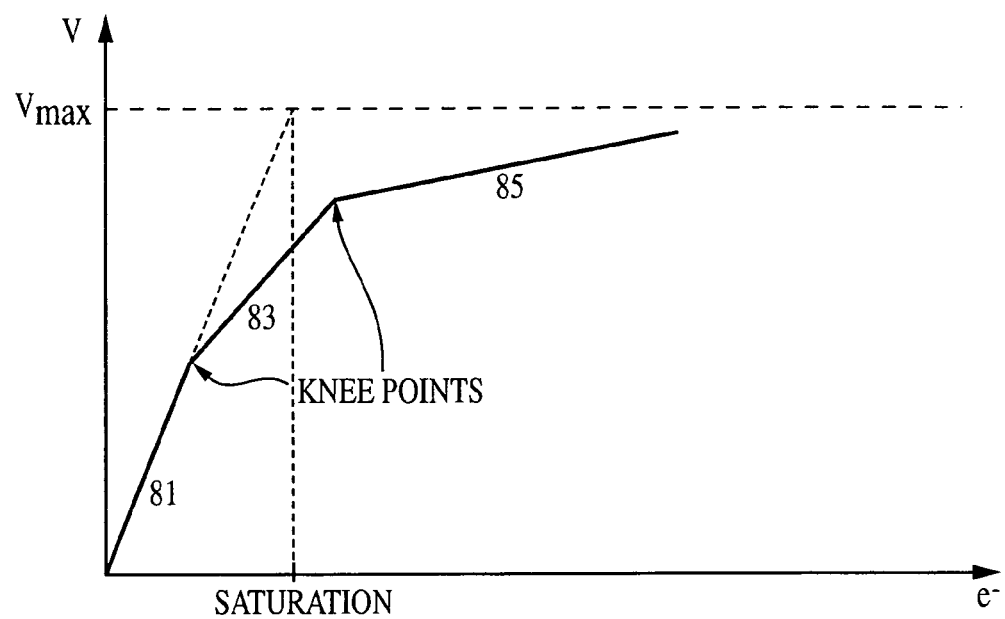
FIG. 12 is a charge-voltage graph of a pixel cell of the embodiment of FIGS. 11A-11D of the present invention.

According to this operation, the output reading is taken when the booster switch gate voltages are lowered to two desired levels, which are designed to create two knees in the charge-voltage profile, as shown in FIG. 12. The first segment 81 of the charge-voltage profile below the knee reflects the higher conversion gain of the pixel when the charge is at such a low level that it can be entirely stored in the floating diffusion region. The second segment 83 above the first knee reflects a slightly higher level of charge, such that some of the charge is stored in booster switch B as well as the floating diffusion region. The third segment 85 above the second knee reflects an even higher level of charge, such that both booster switch B and the floating diffusion region are full, and some additional charge is stored in booster switch A as well. For example, the readout voltage for the level of light depicted in FIG. 11D would be in the second segment 83, close to the second knee, since the floating diffusion region is full and the booster switch B is nearly full. As with the 5T pixel of FIGS. 8A-8H, the knee decision point of a 6T pixel can be adjusted by adjusting the decrease in voltage applied to the booster switches A and B. Alternatively, one or both of the booster switches may be used on, off, or at mid-level, such that the 6T pixel behaves as a 5T pixel according to either the two-reading embodiment or the single-reading embodiment of the present invention.

Figure 1:
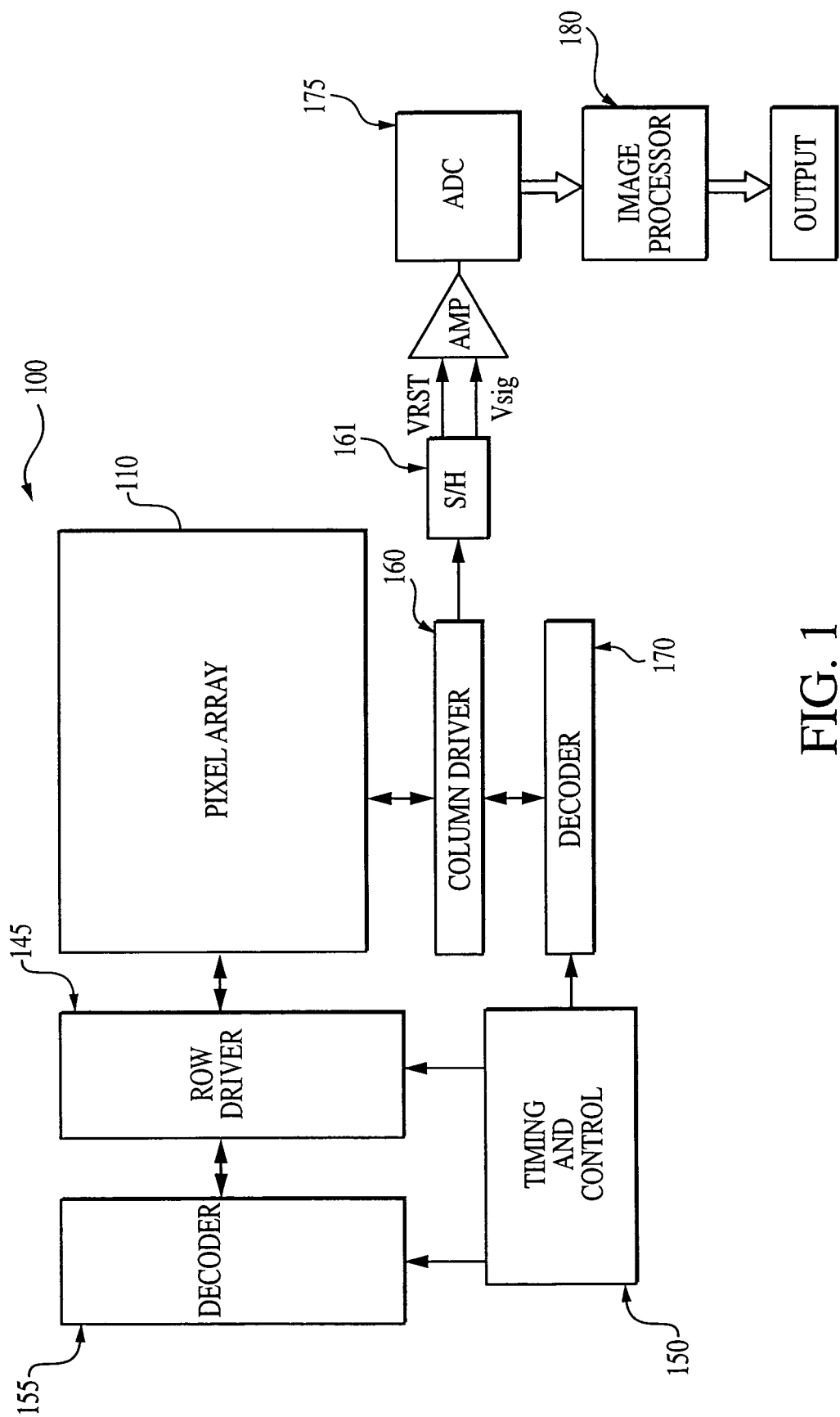
FIG. 1 is a block diagram of an imaging device.
Figure 13:
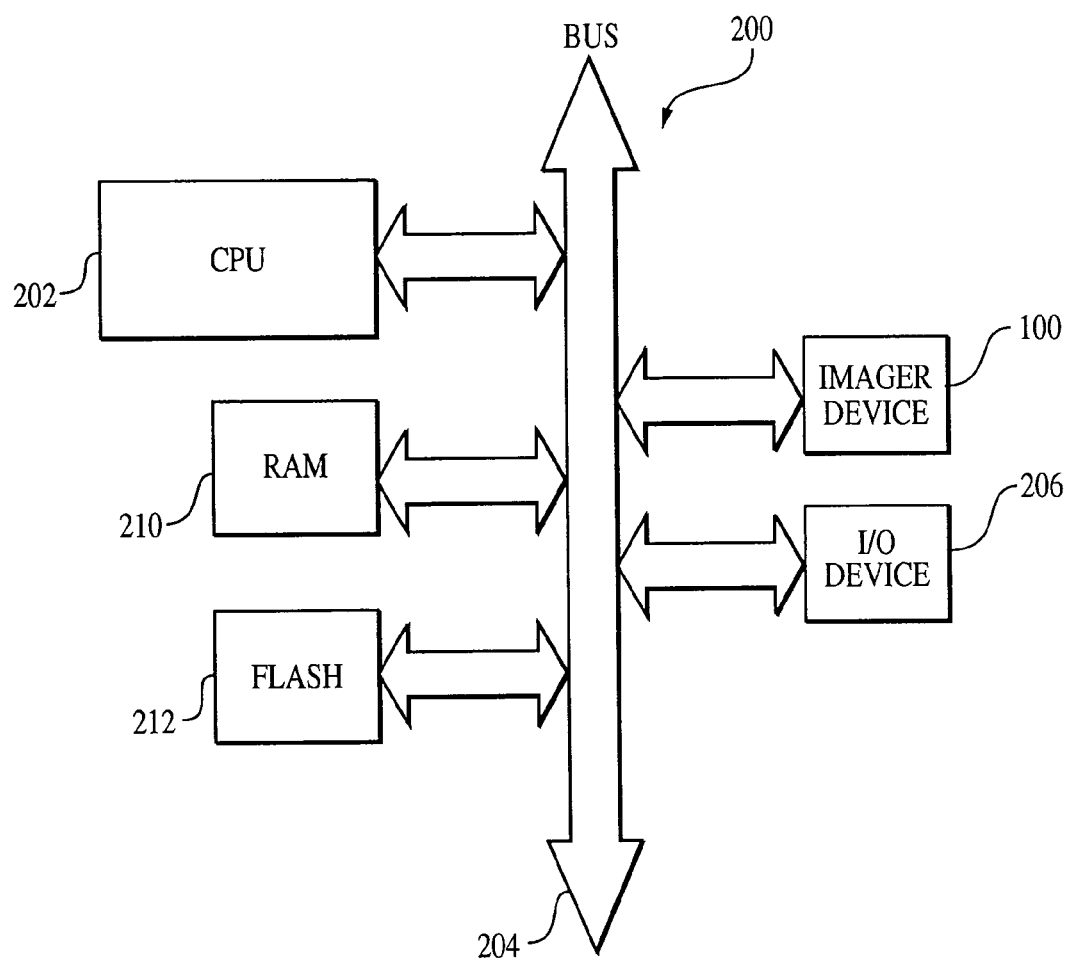
FIG. 13 shows a camera device incorporating at least one pixel cell constructed in accordance with an embodiment of the invention.

The pixel of the present invention can be used in a pixel array 110 of the imager device 100 illustrated in FIG. 1. FIG. 13 shows a camera device 200, a typical processor-based camera device modified to include an imager device 100 (FIG. 1) employing pixels of the present invention as an input device to the device 200. The imager device 100 may also receive control or other data from camera device 200 as well.

Camera device 200 includes a central processing unit (CPU) 202 that communicates with various devices over a bus 204. Some of the devices connected to the bus 204 provide communication into and out of the system 200, illustratively including an input/output (I/O) device 206 and imager device 100. Other devices connected to the bus 204 provide memory, illustratively including a random access memory system (RAM) 210, and a peripheral memory device such as FLASH memory 212. The imager device 100 may be a CCD imager or CMOS imager constructed in accordance with any of the illustrated embodiments.

Figure 14:
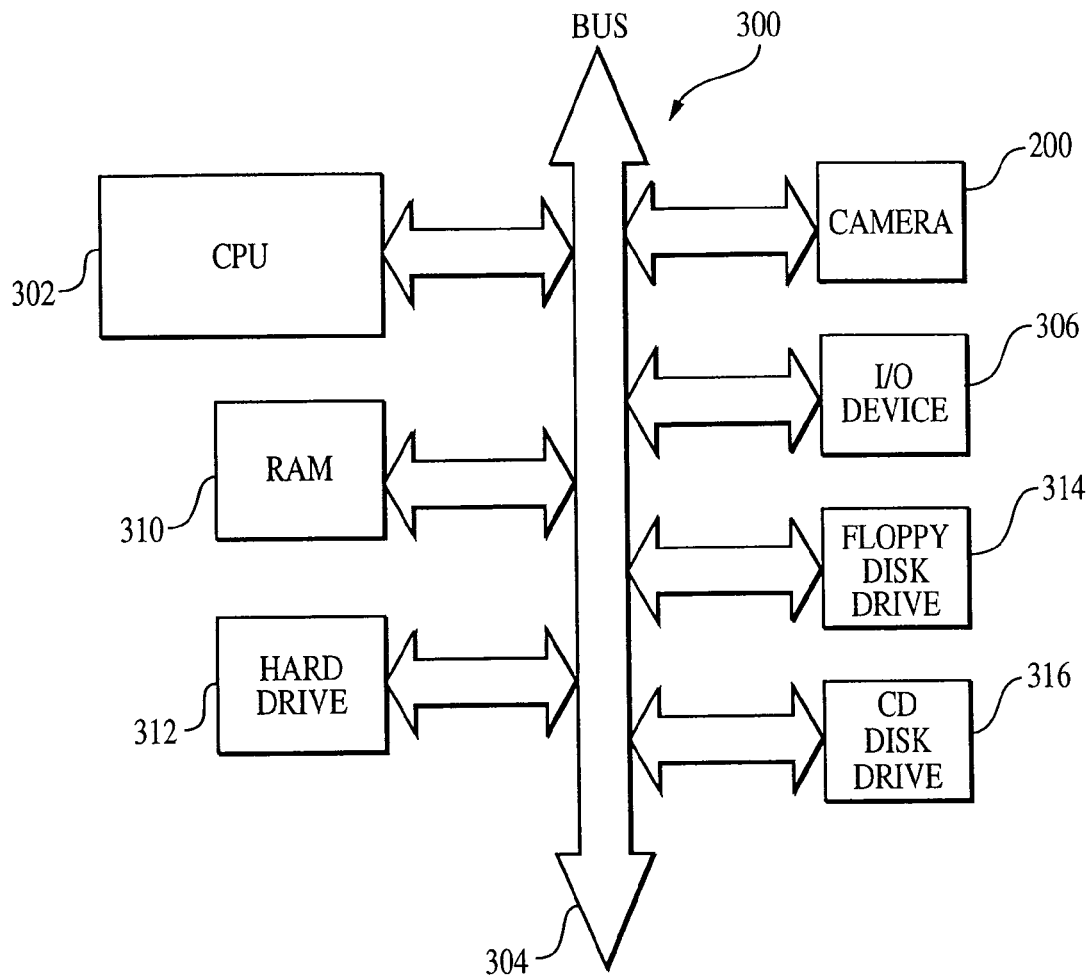
FIG. 14 shows a processor system incorporating at least one camera device constructed in accordance with an embodiment of the invention.

The camera device 200 may also be included in a processor-based camera system 300, as illustrated in FIG. 14. Examples of processor-based camera systems 300 which may employ the camera device 200, include, without limitation, computer systems, camera systems, scanners, machine vision systems, vehicle navigation systems, video telephones, surveillance systems, auto focus systems, star tracker systems, motion detection systems, image stabilization systems, and others.

System 300 includes a central processing unit (CPU) 302 that communicates with various devices over a bus 304. Some of the devices connected to the bus 304 provide communication into and out of the system 300, illustratively including an input/output (I/O) device 306 and camera device 200. Other devices connected to the bus 304 provide memory, illustratively including a random access memory system (RAM) 310, hard drive 312, and one or more peripheral memory devices such as a floppy disk drive 314 and compact disk (CD) drive 316. The camera device 200 may be combined with a processor, such as a CPU, digital signal processor, or microprocessor, in a single integrated circuit.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. An imager system comprising:
 a pixel array comprising a plurality of pixels, each pixel comprising:
  a photosensor;
  a first storing means for receiving and storing charges from the photosensor;
  a storage-changing means for changing the capacitance of the first storing means, wherein the storage-changing means is operable to receive a first control signal that turns the storage-changing means only partially on, wherein the storage-changing means is operable to receive a second control signal that turns the storage-changing means on, wherein the first control signal is at a first voltage level, and wherein the second control signal is at a second voltage level that is greater than the first voltage level; and
  a readout means for providing at least one pixel output signal that corresponds at least to a charge stored in the first storing means while said storage-changing means is turned only partially on; and
 an image processor for producing an image signal based on the output signals provided by the pixels.

2. The imager system of claim 1, where, when the first control signal is received by the storage-changing means, only a portion of an intrinsic capacitance of the storage-changing means is added to a capacitance of the first storing means.

3. An imager system comprising:
 an image processor; and
 an imaging device coupled to the processor and comprising:
  a pixel array comprising a plurality of pixels each of the pixels comprising:
   a photosensor;
   a charge-storing means for receiving and storing charges from the photosensor;
   a storage-changing means for selectively changing the capacitance of the charge-storing means, wherein the storage-changing means has an intrinsic capacitance;
   a controlling means for causing the storage-changing means to add or remove at least a portion of intrinsic capacitance of the storage-changing means to the capacitance of the storing means, wherein the controlling means is operable to apply a first control signal to the storage-changing means that turns the storage-changing means only partially on, wherein the controlling means is operable to apply a second control signal to the storage-changing means that turns the storage-changing means on, wherein the first control signal is at a first voltage level, and wherein the second control signal is at a second voltage level that is greater than the first voltage level; and
   a readout means for providing an output signal during a portion of a readout period, wherein the output signal is output while said storage-changing means is turned only partially on.

4. The imager system of claim 3, wherein the controlling means, when the first control signal is applied to the storage-changing means, adds only a portion of intrinsic capacitance of the storage-changing means to the capacitance of the storing means.

5. A method of operating an imaging system, wherein the imaging system comprises a photosensor, a charge storage node having a capacitance, and a capacitive structure that has a capacitance and that, in response to control signals, selectively changes the capacitance of the charge storage node, the method comprising:
 with the photosensor, converting incident light into an electrical charge;
 transferring the electrical charge from the photosensor to at least the charge storage node;
 applying a first control signal to the capacitive structure that partially activates the capacitive structure such that:
  when the electrical charge has a magnitude that is below a threshold level, the capacitance of the charge storage node is not substantially increased by the capacitance of the capacitive structure and the electrical charge is stored substantially entirely by the charge storage node; and
  when the electrical charge has a magnitude that is above the threshold level, the capacitance of the charge storage node is increased by a portion of the capacitance of the capacitive structure, a first portion of the electrical charge is stored in the charge storage node, and a second portion of the electrical charge is stored in the capacitive structure; and
 applying a second control signal to the capacitive structure that activates the capacitive structure such that the capacitance of the charge storage node is increased by the capacitance of the capacitive structure, wherein the first control signal is at a first voltage level and wherein the second control signal is at a second voltage level that is greater than the first voltage level.

6. The method defined in claim 5 wherein the capacitive structure comprises a gate structure, a source region, and a drain region, wherein the source and drain regions are both connected to the charge storage node, and wherein applying the control signal to the capacitive structure comprises applying the control signal to the gate structure of the capacitive structure.

7. The method defined in claim 5 wherein the charge storage device comprises a floating diffusion node, wherein the capacitive structure comprises a gate structure, a source region, and a drain region, wherein the source and drain regions are both connected to the charge storage node, and wherein applying the control signal to the capacitive structure comprises applying the control signal to the gate structure of the capacitive structure.

8. The method defined in claim 5 wherein transferring the electrical charge from the photosensor to at least the charge storage node comprises transferring the electrical charge from the photosensor to the charge storage node and the capacitive structure while applying the second control signal to the capacitive structure.

9. The method defined in claim 8 wherein applying the first control signal to the capacitive structure to partially activate the capacitive structure comprises applying the first control signal after transferring the electrical charge from the photosensor to the charge storage node and the capacitive structure while applying the second control signal to the capacitive structure.

* * * * *